(12) United States Patent
Zeng et al.

(10) Patent No.: US 12,402,521 B2
(45) Date of Patent: Aug. 26, 2025

(54) DISPLAY SUBSTRATE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kewen Zeng, Beijing (CN); Yucheng Chan, Beijing (CN); Xiangfei He, Beijing (CN); Li Jia, Beijing (CN); Teng Chen, Beijing (CN); Gong Chen, Beijing (CN); Bo Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 522 days.

(21) Appl. No.: 17/789,168

(22) PCT Filed: Aug. 10, 2021

(86) PCT No.: PCT/CN2021/111722
§ 371 (c)(1),
(2) Date: Jun. 25, 2022

(87) PCT Pub. No.: WO2022/068409
PCT Pub. Date: Apr. 7, 2022

(65) Prior Publication Data
US 2023/0056754 A1 Feb. 23, 2023

(30) Foreign Application Priority Data
Sep. 30, 2020 (CN) .......................... 202011065609.9

(51) Int. Cl.
*H10K 77/10* (2023.01)
*H10K 59/12* (2023.01)
(Continued)

(52) U.S. Cl.
CPC ......... *H10K 77/111* (2023.02); *H10K 59/124* (2023.02); *H10K 71/00* (2023.02);
(Continued)

(58) Field of Classification Search
None
See application file for complete search history.

(56) References Cited

U.S. PATENT DOCUMENTS

2008/0218369 A1* 9/2008 Krans .................. A47G 11/003
313/511
2016/0035806 A1* 2/2016 Park ..................... H10K 59/121
257/40
(Continued)

FOREIGN PATENT DOCUMENTS

CN 110224006 A 9/2019
CN 110311057 A 10/2019
(Continued)

OTHER PUBLICATIONS

International Search Report for PCT/CN2021/111722 Mailed Nov. 11, 2021.
(Continued)

*Primary Examiner* — Julio J Maldonado
*Assistant Examiner* — Pinaki Das
(74) *Attorney, Agent, or Firm* — Ling Wu; Stephen Yang; Ling and Yang Intellectual Property

(57) ABSTRACT

A display substrate and a manufacturing method therefor, and a display device. The display substrate comprises a stretchable area, the stretchable area comprises multiple pixel island areas spaced apart from each other, multiple
(Continued)

hole areas, and connection bridge areas located between the pixel island areas and the hole areas; each of the hole areas is provided with one or more openings, and comprises a composite structural layer stacked on the substrate, each of the openings penetrates through the composite structural layer and a part of the opening is provided in the substrate, the opening penetrates through or does not penetrate through the substrate, and the wall of the opening is provided with separation grooves; and each of the hole areas further comprises a functional film layer provided on the composite structural layer and on the wall of each opening, and the functional film layer is separated at the separation grooves.

16 Claims, 8 Drawing Sheets

(51) Int. Cl.
    *H10K 59/124*     (2023.01)
    *H10K 59/35*     (2023.01)
    *H10K 71/00*     (2023.01)
    *H10K 102/00*     (2023.01)

(52) U.S. Cl.
    CPC ....... *H10K 59/1201* (2023.02); *H10K 59/352* (2023.02); *H10K 2102/311* (2023.02)

(56) References Cited

U.S. PATENT DOCUMENTS

| | | | | |
|---|---|---|---|---|
| 2019/0081273 | A1* | 3/2019 | Sung | H10K 50/844 |
| 2020/0057330 | A1* | 2/2020 | Yamazaki | H10K 59/121 |
| 2020/0127233 | A1* | 4/2020 | Sung | H10K 59/121 |
| 2020/0136068 | A1* | 4/2020 | Lee | H10K 59/122 |
| 2020/0152842 | A1* | 5/2020 | Park | H01L 27/15 |
| 2020/0235179 | A1 | 7/2020 | Baik et al. | |
| 2020/0328269 | A1* | 10/2020 | Shin | H10K 59/8731 |
| 2020/0365825 | A1 | 11/2020 | Yu | |
| 2021/0273029 | A1* | 9/2021 | Bang | H10K 59/122 |

FOREIGN PATENT DOCUMENTS

| | | |
|---|---|---|
| CN | 111180485 A | 5/2020 |
| CN | 111293235 A | 6/2020 |
| CN | 111341210 A | 6/2020 |
| CN | 111490071 A | 8/2020 |
| CN | 111564482 A | 8/2020 |
| CN | 111653595 A | 9/2020 |
| CN | 112186023 A | 1/2021 |

OTHER PUBLICATIONS

Office Action dated Nov. 2, 2021 for Chinese Patent Application No. 202011065609.9 and English Translation.

Decision to Grant dated Apr. 8, 2022 for Chinese Patent Application No. 202011065609.9 and English Translation.

* cited by examiner

DISPLAY SUBSTRATE AND MANUFACTURING METHOD THEREFOR, AND DISPLAY DEVICE

CROSS-REFERENCE TO RELATED APPLICATIONS

The present application is a U.S. National Phase Entry of International Application PCT/CN2021/111722 having an international filing date of Aug. 10, 2021, which claims priority of Chinese Patent Application No. 202011065609.9, filed to the CNIPA on Sep. 30, 2020 and entitled "Display Substrate and Manufacturing Method Therefor, and Display Device", the contents disclosed in the above-mentioned applications are hereby incorporated as a part of this application.

TECHNICAL FIELD

Embodiments of the present disclosure relate to, but are not limited to, the field of display technologies, and in particular to a display substrate and a method for manufacturing the display substrate, and a display device.

BACKGROUND

Organic Light Emitting Diode (OLED) display technology has been developed rapidly in recent years because of its large viewing angle, high brightness, fast response, low power consumption, and flexibility, and it is considered as the most potential display technology. With the development of society and the progress of technology, people have higher and higher requirements for screen proportions of electronic products, and full screen is the general trend. However, in order to realize a real full screen, the four corners of the screen need to be made into a locally stretchable structure to adapt to a subsequent module bonding process. A deep hole design of an OLED flexible substrate may achieve local stretching function, which is one of important directions for realizing full screen technology.

In a design of an OLED flexible substrate with a deep hole, a common layer of an OLED device will easily to absorb water from the outside after evaporation to the deep hole, which leads to failure of luminescent materials, resulting in local display failure. In some technologies, a separation structure is provided around the deep hole to separate the common layer of the OLED device, so as to achieve a purpose of blocking water and oxygen intrusion channels, and ensure a packaging effect while achieving the local stretching function. However, in this scheme, a new separation structure manufacturing process and a corresponding mask need to be introduced, and the separation structure will occupy space, which reduces the pixel density and affect the display effect.

SUMMARY

The following is a summary of subject matters described herein in detail. The summary is not intended to limit the protection scope of claims.

An embodiment of the present disclosure provides a display substrate, including a stretchable area; the stretchable area includes multiple pixel island areas spaced apart from each other, multiple hole areas, and connection bridge areas located between the pixel island areas and the hole areas; each of the hole areas is provided with one or more apertures and includes a composite structural layer stacked on a base substrate, the one or more apertures penetrate through the composite structural layer and a portion of an aperture is provided in the base substrate, the aperture penetrates through or does not penetrate through the base substrate, and a wall of the aperture is provided with separation grooves; each of the hole areas further includes a functional film layer provided on the composite structural layer and on the wall of the aperture, and the functional film layer is separated at the separation grooves.

An embodiment of the present disclosure further provides a display device including the display substrate.

An embodiment of the present disclosure further provides a method for manufacturing a display substrate; the display substrate includes a stretchable area; the stretchable area includes multiple pixel island areas spaced apart from each other, multiple hole areas, and connection bridge areas located between the pixel island areas and the hole areas; each of the hole area is provided with one or more apertures which penetrate through or do not penetrate through a base substrate; the manufacturing method includes:

forming a composite structural layer on the base substrate of the hole areas, wherein the base substrate includes a flexible layer and a barrier layer that are stacked, the composite structural layer includes an inorganic composite insulating layer provided on the barrier layer and an organic composite layer provided on the inorganic composite insulating layer;

forming a first opening on the organic composite layer, wherein the first opening exposes a surface of the inorganic composite insulating layer;

forming a second opening on a portion of the inorganic composite insulating layer exposed by the first opening, wherein the second opening penetrates through the barrier layer and exposes a surface of the flexible layer;

forming a third opening on the flexible layer, wherein the third opening penetrates through or does not penetrate through the flexible layer, an orthographic projection of the third opening on the base substrate includes an orthographic projection of the second opening on the base substrate, the first opening, the second opening, and the third opening form an aperture, the third opening forms a separation groove with respect to an enlarged portion of the second opening in a direction parallel to the base substrate, and the separation groove is provided on a wall of the aperture; and forming a functional film layer on the composite structural layer, wherein the functional film layer is provided on the wall of the aperture and is separated at the separation groove.

Other aspects may be understood upon reading and understanding of the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, and do not form a limitation on the technical solutions of the present disclosure.

FIG. 2c is a schematic diagram of a cross-sectional structure at a position A-A in FIG. 2a.

FIG. 11b is a schematic diagram of a partially enlarged structure at position A in FIG. 11a.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should fall within the scope of the claims of the present disclosure.

Figure 1:
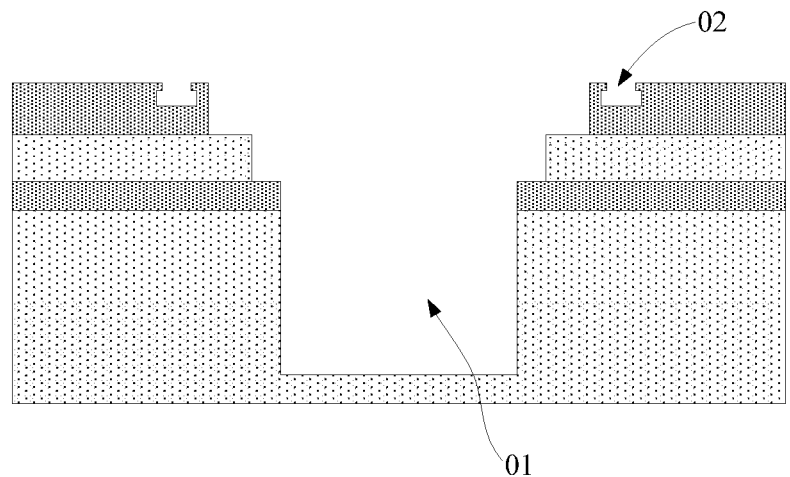
FIG. 1 is a schematic diagram of a deep hole and a separation structure of some hole areas of a display substrate.

In some techniques, as shown in FIG. 1, a stretchable area of an OLED display substrate is provided with a deep hole 01 that penetrates or does not penetrate through a flexible base substrate. An separation structure 02 is provided around the deep hole 01, wherein the separation structure 02 is a groove structure, and a cross-sectional area of a notch of the groove is smaller than a cross-sectional area of the rest of the groove. A common layer of an evaporated OLED device (such as an organic light emitting layer and a cathode) is separated at the separation structure 02 to form a first portion on a side of the separation structure 02 close to the deep hole 01, and a second portion located on a side of the separation structure 02 away from the deep hole 01. The second portion includes the common layer of the OLED device in a pixel area, so that water and oxygen in the first portion will not intrude into the second portion, thus achieving a purpose of blocking the water and oxygen intrusion channels. However, in this scheme, a new separation structure manufacturing process and a corresponding mask need to be introduced, and the separation structure will occupy space, reduce a pixel density and affect a display effect.

Figure 2A:
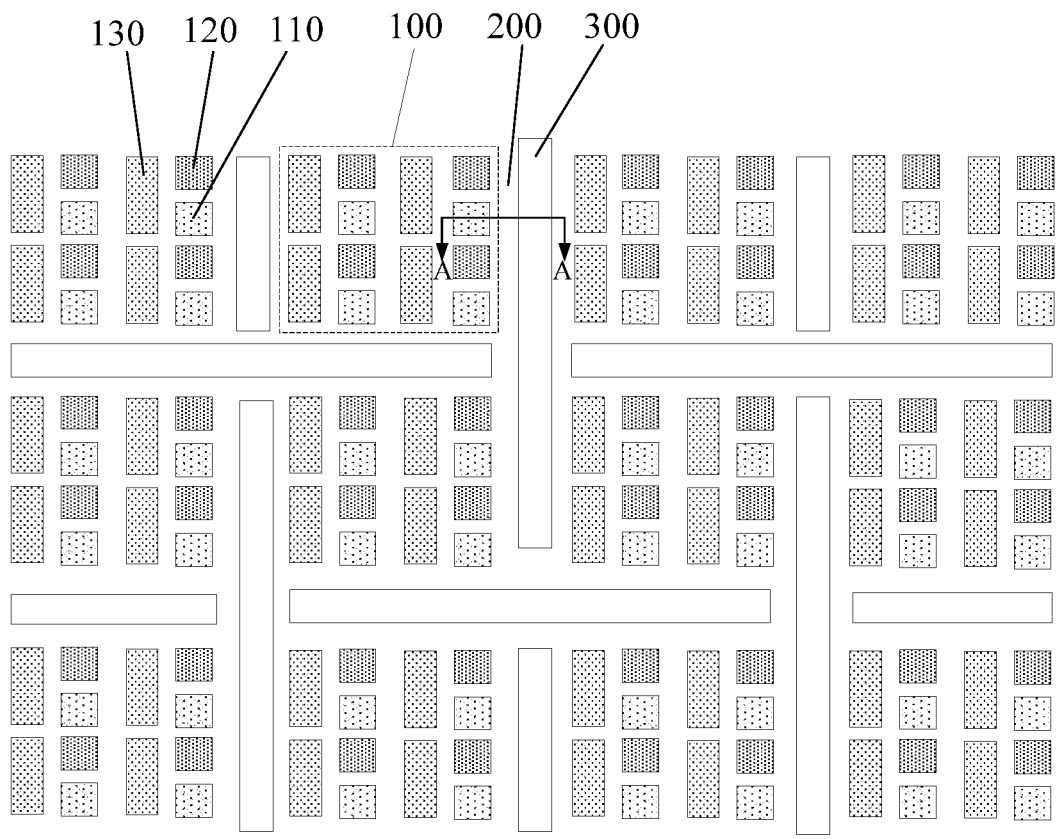
FIG. 2a is a schematic diagram of a planar structure of a stretchable area of a display substrate according to an embodiment of the present disclosure.

An embodiment of the present disclosure provides a display substrate including a stretchable area. In some exemplary embodiments, as shown in FIG. 2a, a structure of a portion of the stretchable area may be seen as a repeative unit of the stretchable area. The stretchable area includes multiple pixel island areas 100 spaced apart from each other, multiple hole areas 300, and connection bridge areas 200 located between the pixel island areas 100 and the hole areas 300. Each pixel island area 100 may be surrounded by multiple hole areas 300, a connection bridge area 200 is located between adjacent hole areas 300 and is connected with an adjacent pixel island area 100, and light emitting devices of the multiple pixel island areas 100 are in signal communication through connection lines of the connection bridge areas 200. Each hole area 300 is provided with one or more aperture that penetrate or not penetrate through the base substrate of the display substrate. The base substrate of the display substrate may be a flexible base substrate so that the stretchable area of the display substrate can be stretched. The pixel island areas 100 are configured to display an image, the hole areas 300 are configured to provide deformation space upon stretching, and the connection bridge areas 200 are configured to route (to implement signal communication between adjacent pixel island areas 100) and transmit a pulling force. Each pixel island area 100 may include multiple pixel units. Each pixel unit includes multiple sub-pixels emitting light of different colors, for example, each pixel unit includes three sub-pixels, i.e., a first sub-pixel 110, a second sub-pixel 120, and a third sub-pixel 130, which may be configured to emit red light, green light, and blue light, respectively. By adjusting the luminance of multiple sub-pixels of each pixel unit, the corresponding pixel unit can basically display any desired color. Each sub-pixel of the pixel island area 100 includes one light emitting device, wherein each light emitting device may be an OLED device, including an anode, an organic light emitting layer, and a cathode that are stacked, the organic light emitting layer emitting light under a voltage between the anode and the cathode. When the stretchable area is stretched under the action of an external force, deformation mainly occurs in the connection bridge areas 200, and the light emitting devices in the pixel island areas 100 remain basically in shape and are not damaged.

Figure 2B:
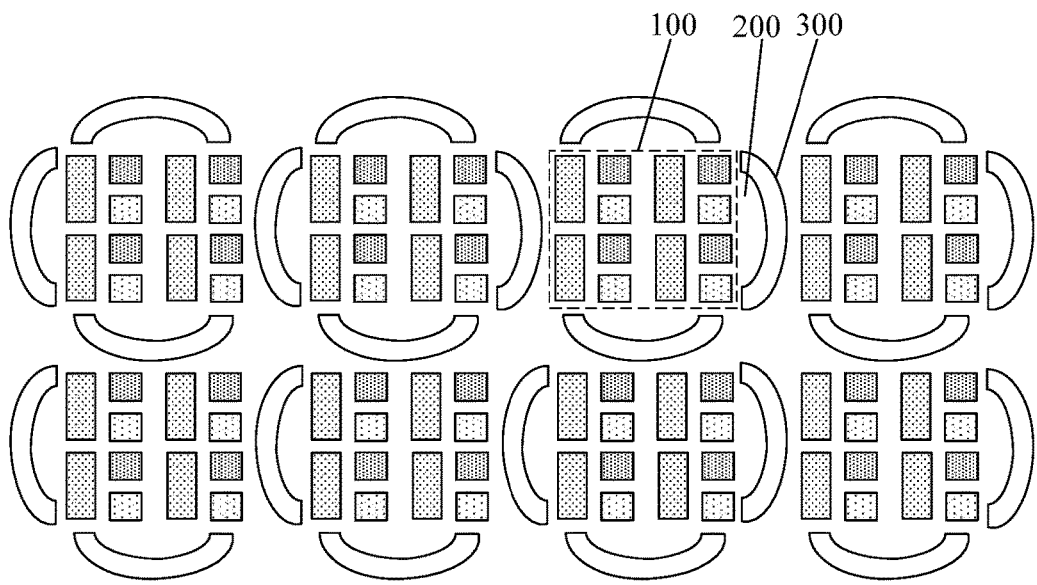
FIG. 2b is a schematic diagram of a planar structure of another stretchable area of a display substrate according to an embodiment of the present disclosure.

In some exemplary embodiments, A shape of each pixel island area may be rectangular or circular or the like in a plane parallel to the display substrate. A shape of each hole area may be rectangular, arc, T-shaped, L-shaped, I-shaped, etc. In some examples, as shown in FIG. 2a, the hole areas 300 are rectangular in shape, and each hole area 300 may be regarded as an aperture (i.e., aperture 301 hereafter). The aperture is rectangular in shape. In a plane parallel to the display substrate, the rectangular aperture may have a width of 5 microns to 20 microns and a length of 50 microns to 800 microns, e.g. 400 microns. In some other exemplary embodiments, as shown in FIG. 2b, FIG. 2b shows another structure of a portion of the stretchable area, which may be seen as a repeative unit of the stretchable area. In FIG. 2b, the hole areas 300 have an arc shape, and each hole area 300 may be regarded as an aperture. The aperture has an arc shape. In a plane parallel to the display substrate, a diameter of the arc-shaped aperture may be 50 microns to 500 microns, for example 200 microns.

Figure 2C:
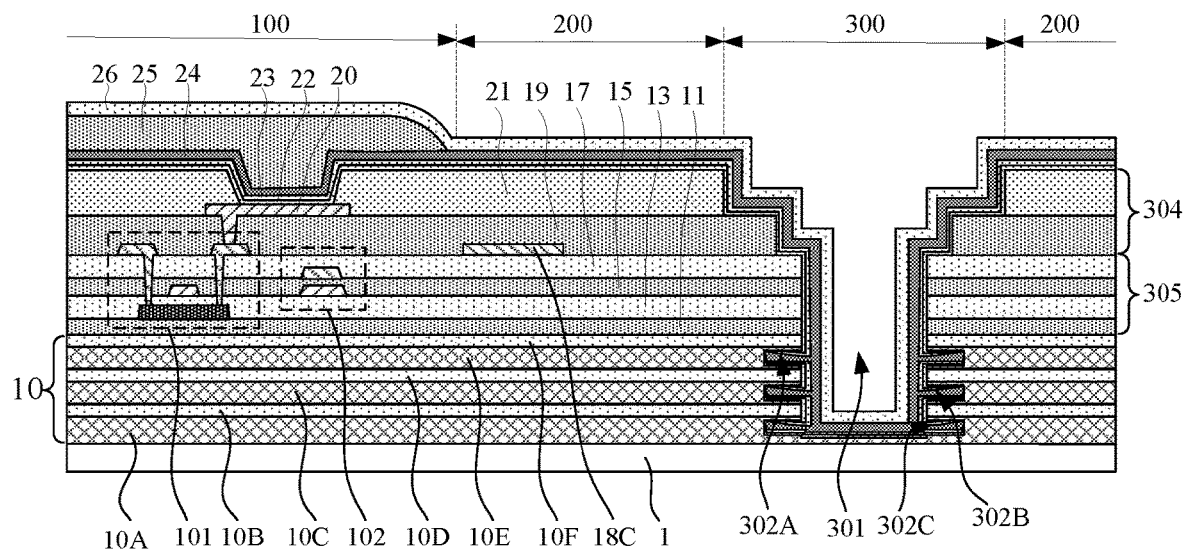

In some exemplary embodiments, as shown in FIG. 2c, FIG. 2c is a cross-sectional view at a position A-A in FIG. 2a, the display substrate according to the embodiment of the present disclosure includes a stretchable area. The stretchable area includes multiple pixel island areas 100 spaced apart from each other, multiple hole areas 300, and connection bridge areas 200 located between the pixel island areas 100 and the hole areas 300. Each of the hole areas 300 is provided with one or more aperture 301 and the hole area 300 includes a composite structural layer stacked on a base substrate 10. The aperture 301 penetrates through the composite structural layer and a part of the aperture 301 is provided in the base substrate 10, the aperture 301 penetrates through or does not penetrate through the base substrate 10, and a wall of the aperture 301 is provided with separation grooves (in some examples, the separation grooves include a first separation groove 302A, a second separation groove 302B and a third separation groove 302C). The hole area 300 further includes a functional film layer provided on the composite structural layer and on the wall of the aperture 301, wherein the functional film layer is separated at the separation grooves.

According to the display substrate of the embodiment of the present disclosure, the separation grooves are provided on the wall of the aperture 301 of the hole area 300. The functional film layer is separated at the separation grooves on the wall of the aperture 301, that is, the functional film layer located on a side of the separation grooves close to a back surface of the base substrate 10 (i.e., a surface of the base substrate 10 facing away from the display side) (this portion of the functional film layer is referred to as a first portion) is no longer connected with the functional film layer located on a side of the separation grooves away from the back surface of the base substrate 10 (this portion of the functional film layer is referred to as a second portion). The second portion includes the functional film layer located in the pixel island area 100. In this way, after the functional film layer is separated by the separation grooves, water and oxygen of the first portion will not intrude into the second portion, so that the separation grooves may block the path of external water and oxygen entering the display substrate along the functional film layer, thus ensuring the packaging effect. In addition, since the separation grooves are provided on the wall of the aperture 301, the stretching function of the stretchable area can be ensured. Moreover, the separation grooves do not occupy an extra space outside the aperture 301 and therefore will not reduce the pixel density. During the formation of the separation grooves, a mask plate is not needed, which can effectively reduce production costs and improve production efficiency.

In some exemplary embodiments, the stretchable area may be located close to an edge of the display substrate or may be located in a middle area of the display substrate. In one example of the embodiment, the display substrate is rectangular, and the stretchable areas may be provided at four corners or at positions close to four side edges of the rectangular display substrate, thereby implementing the stretchable function of corresponding local areas of the display substrate.

In some exemplary embodiments, the base substrate includes a flexible layer and a barrier layer that are stacked, and the flexible layer is provided with the separation grooves. The base substrate may be provided with a flexible layer or multiple flexible layers. In one example of the embodiment, the base substrate includes multiple flexible layers and multiple barrier layers, wherein the flexible layers and the barrier layers are alternately provided, and at least one of the flexible layers is provided with the separation grooves. As shown in FIG. 2c, the base substrate 10 includes a first flexible layer 10A, a first barrier layer 10B, a second flexible layer 10C, a second barrier layer 10D, a third flexible layer 10E and a third barrier layer 10F that are stacked. The composite structural layer is provided on the third barrier layer 10F, the third flexible layer 10E is provided with a first separation groove 302A, the second flexible layer 10C is provided with a second separation groove 302B, and the first flexible layer 10A is provided with a third separation groove 302C.

In this example, the first flexible layer 10A, the second flexible layer 10C and the third flexible layer 10E may be made of polyimide (PI), or polyethylene terephthalate (PET), or other materials. The first barrier layer 10B, the second barrier layer 10D, and the third barrier layer 10F may be made of an inorganic material such as silicon nitride (SiNx) or silicon oxide (SiOx) or the like. The base substrate 10 may further include a first amorphous silicon (a-si) layer provided between the first barrier layer 10B and the second flexible layer 10C, and a second amorphous silicon layer provided between the second barrier layer 10D and the third flexible layer 10E. An amorphous silicon layer may increase a binding force between a barrier layer and a flexible layer, so that after the flexible layer is formed on the barrier layer, it is ensured that the flexible layer can be firmly attached to the barrier layer.

In some exemplary embodiments, the separation grooves may be provided in a circumferential direction of the aperture 301 in a closed annular structure and the separation grooves may have a same shape as the aperture 301, as shown in FIG. 2c. A cross-sectional shape of the separation grooves in a direction perpendicular to the base substrate 10 may be rectangular, trapezoidal, semi-elliptical or other irregular patterns. A first groove surface 3021 of a separation groove may be a curved surface (such as a cambered surface) or an inclined surface or the like. A depth of the separation groove in a direction parallel to the base substrate 10 may gradually increase in a direction away from the base substrate 10. The depth of the separation groove in the direction parallel to the base substrate 10 and its width in the direction perpendicular to the base substrate 10 may be designed as desired, provided that the organic functional layer 22 can be ensured to be separated at the separation groove.

In some exemplary embodiments, the aperture 301 is rectangular in shape, and the aperture 301 has a width of 5 microns to 20 microns and a length of 50 microns to 800 microns. In other examples, the aperture 301 has an arc shape and the aperture 301 has a diameter of 50 microns to 500 microns.

In some exemplary embodiments, the depth of the separation groove in the direction parallel to the base substrate 10 is greater than or equal to 0.5 microns. Each of the flexible layers has a thickness of 5 microns to 12 microns.

Figure 11A:
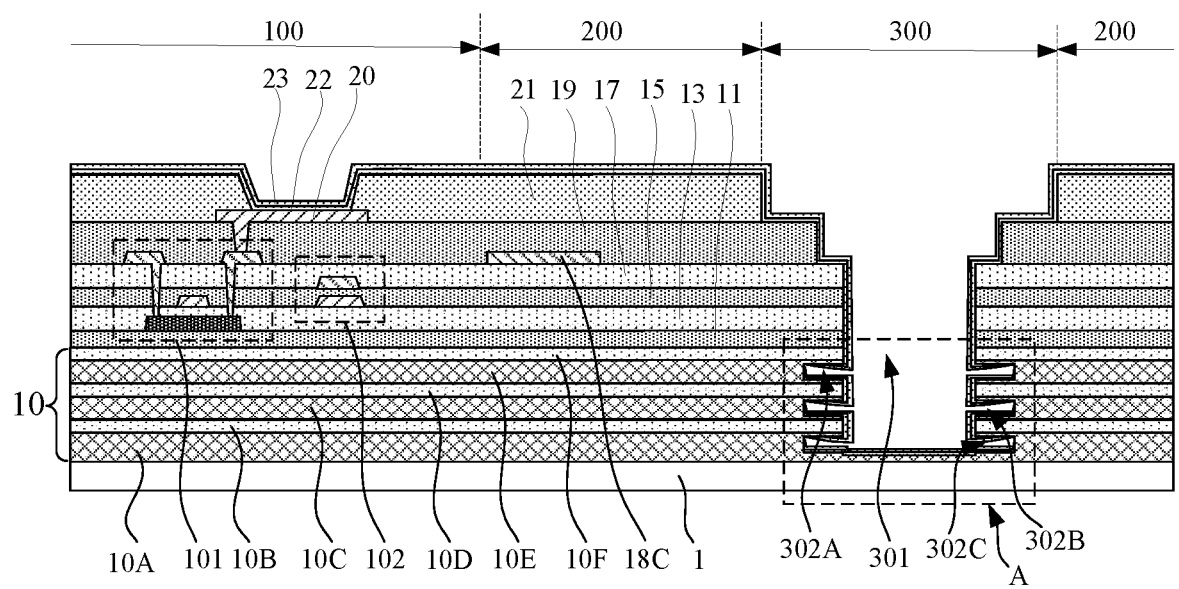
FIG. 11a is a schematic diagram of a structure after an organic functional layer and a cathode are formed in some exemplary embodiments.
Figure 11B:
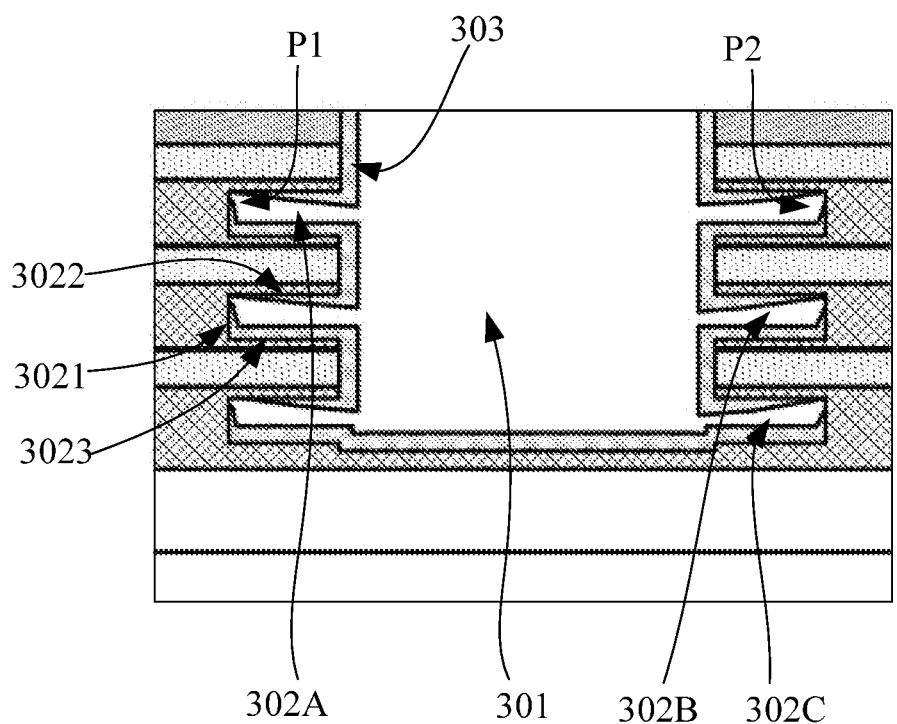

In some exemplary embodiments, as shown in FIG. 11*b*, FIG. 11*b* shows a schematic diagram of a structure in which a functional film layer of the hole area 300 is formed within the aperture 301. An inner surface of a separation groove (the first separation groove 302A, the second separation groove 302B and the third separation groove 302C are shown in this example) includes a first groove surface 3021 facing the aperture 301, a second groove surface 3022 facing the back side of the base substrate 10 (i.e., a side of the base substrate 10 facing away from the display side), and a third groove surface 3023 opposite the second groove surface 3022.

In some exemplary embodiments, as shown in FIG. 11*b*, the first groove surface 3021, the second groove surface 3022, and the third groove surface 3023 are each formed by a flexible layer where the separation groove is located. In FIG. 11*b*, the first separation groove 302A is formed in the third flexible layer 10E, the second separation groove 302B is formed in the second flexible layer 10C, and the third separation groove 302C is formed in the first flexible layer 10A. The third flexible layer 10E forms the first groove surface 3021, the second groove surface 3022 and the third groove surface 3023 of the first separation groove 302A. The second flexible layer 10C forms the first groove surface 3021, the second groove surface 3022 and the third groove surface 3023 of the second separation groove 302B. The first flexible layer 10A forms the first groove surface 3021, the second groove surface 3022 and the third groove surface 3023 of the third separation groove 302C.

In some exemplary embodiments, the first groove surface is formed by the flexible layer where the separation groove is located.

The second groove surface is jointly formed by the flexible layer where the separation groove is located and a film layer provided on a side surface of the flexible layer away from the back side of the base substrate, or the second groove surface is formed by a film layer provided on a side surface of the flexible layer where the separation groove is located away from the back side of the base substrate.

The third groove surface is jointly formed by the flexible layer where the separation groove is located and a film layer provided on a side surface of the flexible layer facing the back side of the base substrate, or the third groove surface is formed by a film layer provided on a side surface of the flexible layer where the separation groove is located facing the back side of the base substrate.

In some exemplary embodiments, as shown in FIG. 11*b*, the functional film layer 303 is further provided on the first groove surface 3021, the second groove surface 3022, and the third groove surface 3023 of the separation groove, and the functional film layer 303 is separated at an intersection of the first groove surface 3021 and the second groove surface 3022 (positions indicated by P1 and P2 in FIG. 11*b*). The functional film layer 303 becomes thinner in the vicinity of the intersection of the first groove surface 3021 and the second groove surface 3022. The functional film layer 303 may be formed by an evaporation process in the manufacturing process.

In some exemplary embodiments, the pixel island area 100 includes a drive structure layer provided on the base substrate 10 and multiple light emitting devices provided on the drive structure layer. The drive structure layer includes a pixel driving circuit, and each of the multiple light emitting devices includes an anode 20, an organic functional layer 22, and a cathode 23 that are stacked. The organic functional layer 22 includes an organic light emitting layer. The functional film layer includes a first functional film layer and a second functional film layer that are stacked, wherein the first functional film layer has a same material as one film layer of the organic functional layers 22 of any one of the light emitting devices, and the second functional film layer has a same material as the cathode 23.

In an example of the present embodiment, the pixel driving circuit includes multiple thin film transistors and a storage capacitor, and the anode 20 of the light emitting device is connected to a drain electrode of one of the thin film transistors. The light emitting device may be an OLED device. The organic functional layer 22 includes an organic light emitting layer, and may further include a hole injection layer, a hole transport layer, and an electron blocking layer that are stacked between the organic light emitting layer and the anode 20, and a hole barrier layer, an electron transport layer, and an electron injection layer that are stacked between the organic light emitting layer and the cathode 23. The organic light emitting layer emits light under a voltage between the anode 20 and the cathode 23.

In an example of the present embodiment, each pixel island area 100 may include multiple pixel units, wherein each pixel unit includes multiple sub-pixels emitting light of different colors. For example, each pixel unit includes a red sub-pixel, a green sub-pixel, and a blue sub-pixel. By adjusting the luminance of multiple sub-pixels of each pixel unit, a corresponding pixel unit can basically display any desired color. Each sub-pixel of the pixel island area 100 includes a light emitting device, and the pixel island area 100 includes multiple sub-pixels arranged in an array. In some examples, all sub-pixels of the pixel island area 100 have one or more common film layers, wherein each of the one or more common film layers is in an integral structure and may cover the pixel island area 100, the connection bridge area 200 and the hole area 300. The common film layer may be any one or more of the organic functional layers 22 in one of the light emitting devices, and the cathode 23 in the light emitting device, as shown in FIG. 2*c*. FIG. 2*c* shows a light emitting device of a sub-pixel whose organic functional layer 22 and cathode 23 are common film layers for all sub-pixels of the pixel island area 100. The common film layer is formed on the wall of the aperture 301 after being evaporated into the aperture 301 of the hole area 300 and is disconnected at a separation groove on the wall of the aperture 301. The common film layer may form two portions after being separated by the separation groove (e.g., in an example where one separation groove is provided). The first portion is located on a side of the separation groove close to the back surface of the base substrate 10 (i.e., the surface of the base substrate facing away from the display side). The second portion is located on a side of the separation groove away from the back surface of the base substrate 10, and includes a portion of the common film layer located in the pixel island area 100. The water and oxygen of the first portion does not intrude into the second portion, thereby, the common film layer located in the pixel island area 100 will not be eroded by the water and oxygen.

In an example of the present embodiment, a film-layer structure of the functional film layer of the hole area 300 may be related to the type and number of the common film layer(s) in the organic functional layer of the multiple light emitting devices in the pixel island area 100. For example, in some examples, if all the film layers in the organic functional layer 22 of a light emitting device R are common film layers and the cathode 23 of the light emitting device R is also a common film layer, the functional film layer of the hole area 300 may include all the film layers of the organic functional layer 22 and the cathode 23 of the light emitting device R that are stacked.

In some exemplary embodiments, as shown in FIG. 2c, the composite structural layer includes an inorganic composite insulating layer 305 provided on the base substrate 10, and an organic composite layer 304 provided on the inorganic composite insulating layer 305. A side surface of the inorganic composite insulating layer 305 facing the aperture 301 protrudes from a side surface of the organic composite layer 304 facing the aperture 301 in a direction parallel to the base substrate 10.

In some exemplary embodiments, as shown in FIG. 2c, the organic composite layer 304 includes a first organic layer (e.g., a planarization layer 19) provided on the inorganic composite insulating layer 305, and a second organic layer (e.g., a pixel definition layer 21) provided on the first organic layer. The side surface of the inorganic composite insulating layer 305 facing the aperture 301 is flush in a direction parallel to the base substrate 10. A side surface of the first organic layer facing the aperture 301 protrudes from a side surface of the second organic layer facing the aperture 301, and the side surface of the inorganic composite insulating layer 305 facing the aperture 301 protrudes from the side surface of the first organic layer facing the aperture 301.

A structure of a display substrate according to the present disclosure is described below by an example of a manufacturing process of a display substrate. A "patterning process" mentioned in the present disclosure includes treatments such as film layer deposition, photoresist coating, mask exposure, development, etching, photoresist stripping, etc. The deposition may be any one or more of sputtering, evaporation, and chemical vapor deposition. The coating may be any one or more of spray coating and spin coating. The etching may be any one or more of dry etching and wet etching. A "thin film" refers to a thin film layer prepared from a material on a substrate by a process of deposition or coating. If a patterning process is not needed by a "thin film" throughout a whole preparation process, the "thin film" may also be referred to as a "layer". When a patterning process is also needed by a "thin film" throughout a whole preparation process, the thin film is referred to as a "thin film" before the patterning process and referred to as a "layer" after the patterning process. The "layer" after the patterning process includes at least one "pattern". That "A and B are arranged in the same layer" mentioned in the present disclosure refers to that A and B are simultaneously formed by a same patterning process. "An orthographic projection of A contains an orthographic projection of B" refers to that the orthographic projection of B falls in a range of the orthographic projection of A or the orthographic projection of A covers the orthographic projection of B.

In some exemplary embodiments, the manufacturing process of the display substrate shown in FIG. 2c may include the following steps.

(1) A flexible base substrate 10 is manufactured on a glass carrier plate 1.

In an example of the embodiment of the present disclosure, the flexible base substrate 10 may have a three-layer flexible layer structure. The flexible base substrate 10 includes a first flexible material layer, a first inorganic material layer, a second flexible material layer, a second inorganic material layer, a third flexible material layer and a third inorganic material layer which are sequentially stacked on a carrier plate 1 (may be but not limited to glass material). The first flexible material layer, the second flexible material layer and the third flexible material layer may be made of Polyimide (PI), Polyethylene Terephthalate (PET), or a polymer soft film subjected to a surface treatment, etc. The first inorganic material layer, the second inorganic material layer and the third inorganic material layer may be made of silicon nitride (SiNx) or silicon oxide (SiOx), etc, for improving water and oxygen resistance of the base substrate. The first inorganic material layer, and the second inorganic material layer and the third inorganic material layer are called barrier layers. The flexible base substrate 10 may further include a first semiconductor layer provided between the first inorganic material layer and the second flexible material layer, and a second semiconductor layer provided between the second inorganic material layer and the third flexible material layer. The first semiconductor layer and the second semiconductor layer may be made of amorphous silicon (a-si). The semiconductor layer may increase a bonding force between an inorganic material layer and a flexible material.

Figure 3:
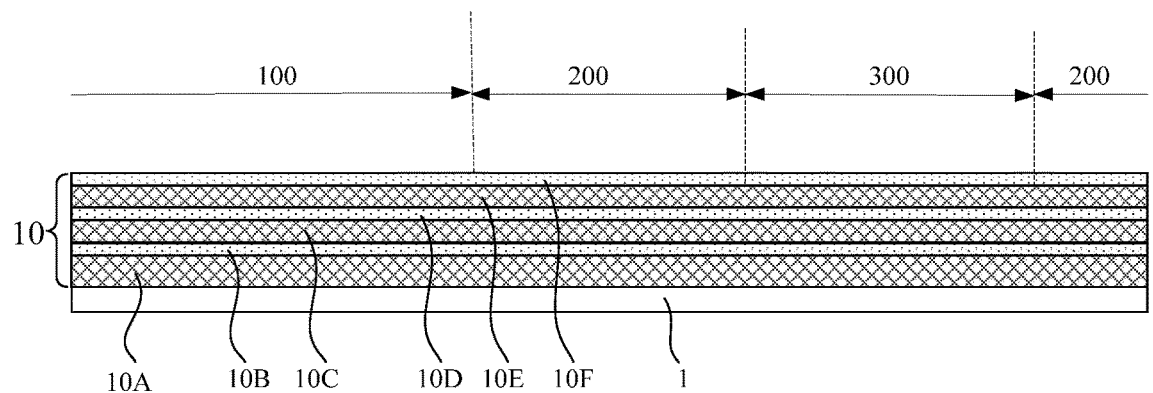
FIG. 3 is a schematic diagram of a structure after a base substrate of a display substrate is formed in some exemplary embodiments.

In an exemplary embodiment, taking a laminated structure of PI1/Barrier1/PI2/Barrier2/PI3/Barrier3 as an example, the manufacturing process of the flexible base substrate 10 may include: first coating a layer of polyimide on the carrier plate 1, and then forming a first flexible (PI1) layer 10A after the polyimide is cured to form a film; then, depositing a layer of barrier thin film on the first flexible layer 10A to form a first barrier (Barrier1) layer 10B covering the first flexible layer 10A; then, further coating a layer of polyimide on the first barrier layer 10B to form a second flexible (PI2) layer 10C after the polyimide is cured to form a film; then, depositing a layer of barrier thin film on the second flexible layer 10C to form a second barrier (Barrier2) layer 10D covering the second flexible layer 10C; then further coating a layer of polyimide on the second barrier layer 10D to form a third flexible (PI3) layer 10E after the polyimide is cured to form a film; and then depositing a layer of barrier thin film on the third flexible layer 10E to form a third barrier (Barrier3) layer 10F covering the third flexible layer 10E, thus completing the manufacturing of the flexible base substrate 10, as shown in FIG. 3. After this process, the pixel island area 100, the connection bridge area 200 and the hole area 300 each include a flexible base substrate 10.

In other examples, a one-layer flexible layer structure, a two-layer flexible layer structure or more than three-layer flexible layer structure may be used for the flexible base substrate 10. The more the number of flexible layers, the larger the depth of the aperture 301 finally formed, and the better the tensile properties of the stretchable area.

Figure 4:
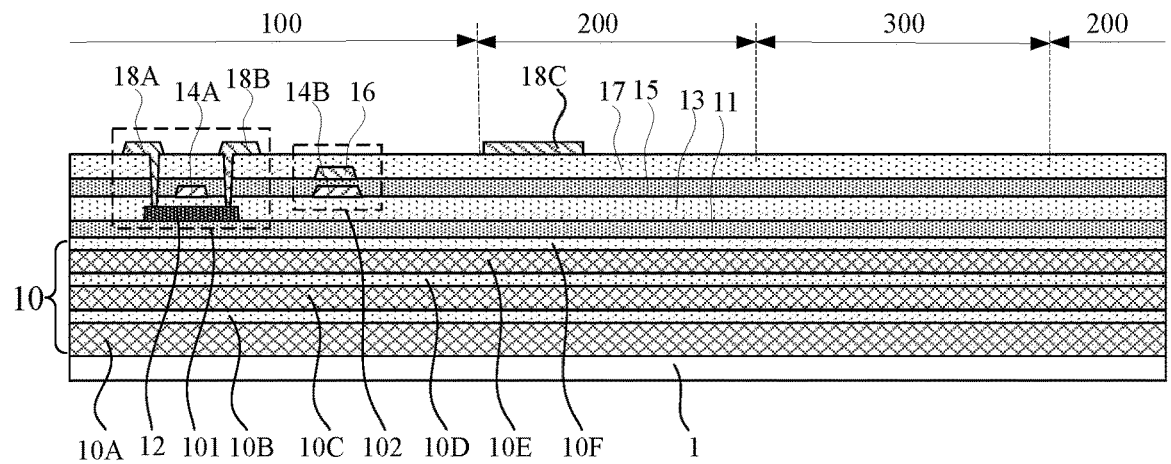
FIG. 4 is a schematic diagram of a structure after a drive structure layer of a pixel island area and an inorganic composite insulating layer of a hole area are formed in a display substrate in some exemplary embodiments.

(2) Patterns of a drive structure layer and a connection line are manufactured on the flexible base substrate 10, wherein the drive structure layer is formed in the pixel island area 100 and the connection line is formed in the connection bridge area 200. The drive structure layer includes multiple gate lines and multiple data lines. The multiple gate lines and the multiple data lines cross perpendicularly to define multiple sub-pixels arranged in a matrix, wherein each sub-pixel is provided with a thin film transistor, as shown in FIG. 4. The manufacturing process of this step may include:

a first insulating thin film and an active layer thin film are sequentially deposited on the flexible base substrate 10, the active layer thin film is patterned by a patterning process to form a first insulating layer 11 covering the entire flexible base substrate 10 and a pattern of an active layer on the first insulating layer 11. The pattern of the active layer is formed in the pixel island area 100, and at least includes an active layer 12. After this patterning process, the connection bridge area 200 and the hole area 300 include the first insulating layer 11 provided on the flexible base substrate 10.

Then, a second insulating thin film and a first metal thin film are sequentially deposited, and the first metal thin film is patterned by a patterning process to form a second insulating layer 13 covering the pattern of the active layer and a pattern of a first gate metal layer provided on the second insulating layer 13. The pattern of the first gate metal layer includes a gate electrode 14A, a first capacitor electrode 14B and a gate line (not shown) formed in the pixel island area 100, and a gate connection line (not shown) formed in the connection bridge area 200. After this patterning process, the hole area 300 includes the first insulating layer 11 and the second insulating layer 13 stacked on the flexible base substrate 10.

Then, a third insulating thin film and a second metal thin film are sequentially deposited, and the second metal thin film is patterned by a patterning process to form a third insulating layer 15 covering the first gate metal layer and a pattern of a second gate metal layer provided on the third insulating layer 15. The pattern of the second gate metal layer includes a second capacitor electrode 16 formed in the pixel island area 100, wherein a position of the second capacitor electrode 16 corresponds to that of the first capacitor electrode 14B. After this patterning process, the connection bridge area 200 and the hole area 300 include the first insulating layer 11, the second insulating layer 13 and the third insulating layer 15 which are stacked on the flexible base substrate 10.

Then, a fourth insulating thin film is deposited and a fourth inorganic insulating thin film is patterned by a patterning process to form a pattern of a fourth insulating layer 17 covering the second gate metal layer. The fourth insulating layer 17 is provided with two via holes, and the fourth insulating layer 17, the third insulating layer 15 and the second insulating layer 13 in the two via holes are etched away to expose a surface of the active layer 12. After this patterning process, the connection bridge area 200 and the hole area 300 include the first insulating layer 11, the second insulating layer 13, the third insulating layer 15 and the fourth insulating layer 17 which are stacked on the base substrate 10.

Subsequently, a third metal thin film is deposited and the third metal thin film is patterned by a patterning process to form a pattern of a third metal layer on the fourth insulating layer 17. The pattern of the third metal layer includes a source electrode 18A, a drain electrode 18B and a data line (not shown) located in the pixel island area 100, and a data connection line 18C located in the connection bridge area 200. The source electrode 18A is connected to a surface of the active layer 12 facing away from the base substrate 10 through one via hole that penetrates through the fourth insulating layer 17, the third insulating layer 15, and the second insulating layer 13, and the drain electrode 18B is connected to the surface of the active layer 12 facing away from the base substrate 10 through another via hole that penetrates through the fourth insulating layer 17, the third insulating layer 15, and the second insulating layer 13. After this patterning process, the film layer structure of the hole area 300 remains unchanged.

At this point, the drive structure layer of the pixel island area 100 and the connection line in the connection bridge area 200 are manufactured on the flexible base substrate 10.

In the drive structure layer of the pixel island area 100, the active layer 12, the gate electrode 14A, the source electrode 18A, and the drain electrode 18B constitute a thin film transistor 101, wherein the thin film transistor 101 may be a driving transistor in the pixel driving circuit, and the drain electrode 18B of the driving transistor is connected to an anode in the light emitting device. The first capacitor electrode 14B and the second capacitor electrode 16 constitute a storage capacitor 102. The connection bridge area 200 and the hole area 300 include an inorganic composite insulating layer 305 provided on the flexible base substrate 10, wherein the inorganic composite insulating layer 305 includes the first insulating layer 11, the second insulating layer 13, the third insulating layer 15, and the fourth insulating layer 17 that are stacked. The connection bridge area 200 further includes a gate connection line provided on the second insulating layer 13, and a data connection line 18C provided on the inorganic composite insulating layer 305. The gate connection line is connected to gate lines in adjacent pixel island areas 100, and the data connection line 18C is may be connected to data lines in the adjacent pixel island areas 100 for signal communication between the adjacent pixel island areas 100.

In an exemplary embodiment, the first insulating thin film, the second insulating thin film, the third insulating thin film and the fourth insulating thin film may be made of any one or more of silicon oxide (SiOx), silicon nitride (SiNx) and silicon oxynitride (SiON), and may be of a single layer, multiple layers or a composite layer. The first insulating layer 11 is referred to as a buffer layer, which is used for improving capabilities of water and oxygen resistance of the flexible base substrate 10. The second insulating layer 13 and the third insulating layer 15 are referred to as gate insulating (GI) layers. The fourth insulating layer 17 is referred to as an interlayer dielectric (ILD) layer. The first metal thin film, the second metal thin film and the third metal thin film may be made of metal materials, such as any one or more of silver (Ag), copper (Cu), aluminum (Al), titanium (Ti) and molybdenum (Mo), or an alloy material of the above metals, such as aluminum neodymium alloy (AlNd) or molybdenum niobium alloy (MoNb), and may have a single-layer structure or a multi-layer composite structure, such as Ti/Al/Ti. The active layer thin film may be made of materials, such as amorphous indium gallium zinc oxide (a-IGZO), zinc oxynitride (ZnON), indium zinc tin oxide (IZTO), amorphous silicon (a-Si), polycrystalline silicon (p-Si), hexathiophene, and polythiophene. Namely, the present disclosure is applicable to transistors manufactured based on oxide technology, silicon technology and organic substances technology.

Figure 5:
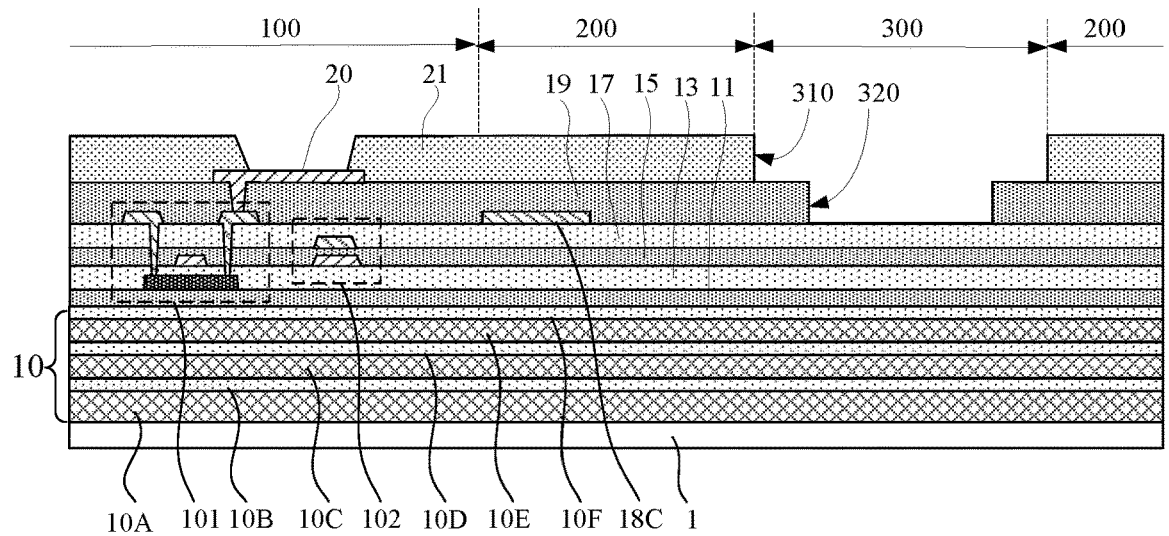
FIG. 5 is a schematic diagram of a structure after a planarization layer, an anode and a pixel definition layer of a pixel island area, and an organic composite layer forming a hole area are formed, and a first via hole and a second via hole are formed on the organic composite layer in a display substrate in some exemplary embodiments.

(3) A planarization layer 19, an anode 20, and a pixel definition layer 21 are formed on the flexible base substrate 10 on which the aforementioned patterns are formed, as shown in FIG. 5. In some exemplary embodiments, the manufacturing process of this step may include:

A planarization thin film of an organic material is coated on the flexible base substrate 10 on which the aforementioned patterns are formed to form a planarization (PLN) layer 19 covering the entire flexible base substrate 10, a via hole is formed on the planarization layer 19 of the pixel island area 100 by masking, exposing and developing processes, and the planarization layer 19 in the via hole is developed away to expose a surface of the drain electrode 18B of the thin film transistor 101. After this patterning process, the connection bridge area 200 and the hole area 300 each include a planarization layer 19 provided on the fourth insulating layer 17.

A transparent conductive thin film is deposited on the flexible base substrate 10 on which the aforementioned patterns are formed and the transparent conductive thin film is patterned by a patterning process to form a pattern of an anode 20. The anode 20 is formed on the planarization layer 19 of the pixel island area 100 and is connected to the drain electrode 18B of the thin film transistor 101 through the via hole on the planarization layer 19. In an exemplary embodiment, the transparent conductive thin film may be made of indium tin oxide (ITO) or indium zinc oxide (IZO).

A pixel definition thin film is coated on the flexible base substrate 10 on which the aforementioned patterns are formed to form a pattern of a pixel definition layer (PDL) by masking, exposing and developing processes. The pixel definition layer 21 of the pixel island area 100 is provided with a pixel opening, and the pixel definition layer 21 in the pixel opening is developed to expose a surface of the anode 20. The pixel definition layer 21 of the hole area 300 is provided with a first via hole 310, wherein the first via hole 310 exposes a surface of the planarization layer 19.

A second via hole 320 is formed in a portion of the planarization layer 19 exposed by the first via hole 310, and the planarization layer 19 in the second via hole 320 is developed to expose a surface of the fourth insulating layer 17. An orthographic projection of the first via hole 310 on the flexible base substrate 10 may include an orthographic projection of the second via hole 320 on the flexible base substrate 10. In the direction parallel to the base substrate 10, a side surface of the planarization layer 19 facing the second via hole 320 protrudes from a side surface of the pixel definition layer 21 facing the first via hole 310. The first via hole 310 and the second via hole 320 are collectively referred to as first openings.

Figure 6:
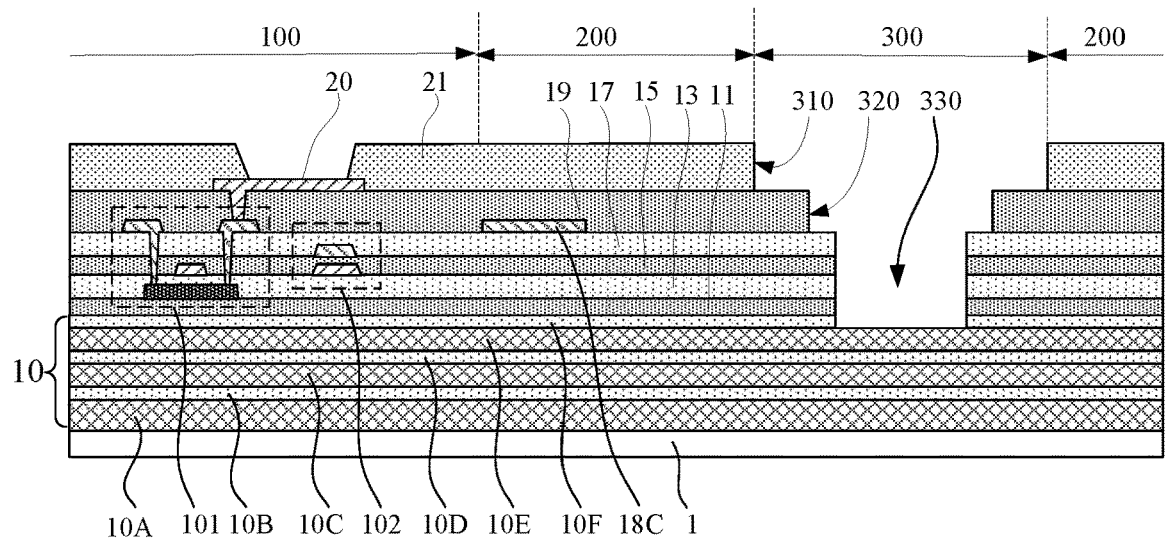
FIG. 6 is a schematic diagram of a structure after a third via hole of a third barrier layer are formed on an inorganic composite insulating layer of a hole area that penetrates through a base substrate in some exemplary embodiments.

(4) A third via hole 330 is formed on a portion of the fourth insulating layer 17 of the hole area 300 exposed by the second via hole 320. The third via hole 330 penetrates through the fourth insulating layer 17, the third insulating layer 15, the second insulating layer 13, the first insulating layer 11 and the third barrier layer 10F of the flexible base substrate 10. The fourth insulating layer 17, the third insulating layer 15, the second insulating layer 13, the first insulating layer 11 and the third barrier layer 10F of the flexible base substrate 10 in the third via hole 330 are etched away, and the third via hole 330 exposes a surface of the third flexible layer 10E. The orthographic projection of the second via hole 320 on the flexible base substrate 10 may include an orthographic projection of the third via hole 330 on the flexible base substrate 10, as shown in FIG. 6.

In a direction parallel to the base substrate 10, side surfaces of the fourth insulating layer 17, the third insulating layer 15, the second insulating layer 13, the first insulating layer 11, and the third barrier layer 10F of the flexible substrate 10 facing the third via hole 330 (which may be regarded as a wall of the third via hole 330) are flush with each other and protrude from the side surface of the planarization layer 19 facing the second via hole 320. The third via hole 330 is referred to as a second opening.

Figure 7A:
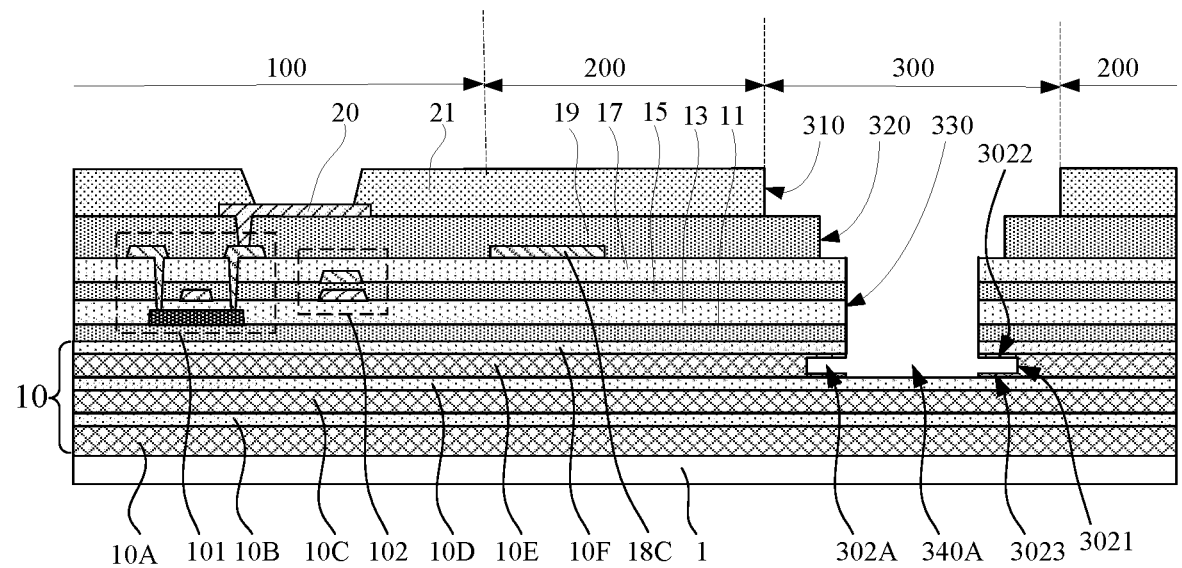
FIG. 7a is a schematic diagram of a structure after a fourth via hole and a first separation groove are formed on a third flexible layer of a base substrate of a hole area in some exemplary embodiments.

(5) A fourth via hole 340A and a first separation groove 302A are formed on the third flexible layer 10E of the hole area 300, as shown in FIG. 7a. A portion of the third flexible layer 10E exposed by the third via hole 330 is completely etched away to form a fourth via hole 340A. An orthographic projection of the fourth via hole 340A on the flexible base substrate 10 may overlap with the orthographic projection of the third via hole 330 on the flexible base substrate 10, or the orthographic projection of the fourth via hole 340A on the flexible base substrate 10 may include the orthographic projection of the third via hole 330 on the flexible base substrate 10. A side surface of the third flexible layer 10E facing the fourth via hole 340A forms the first separation groove 302A, and a notch of the first separation groove 302A faces the fourth via hole 340A and communicates with the fourth via hole 340A. The third flexible layer 10E inside the first separation groove 302A is etched away, and an inner surface of the first separation groove 302A is formed by the third flexible layer 10E. The inner surface of the first separation groove 302A includes a first groove surface 3021 facing the fourth via hole 340A, a second groove surface 3022 facing the back side of the flexible base substrate 10, and a third groove surface 3023 facing away from the back side of the flexible base substrate 10. The third groove surface 3023 is opposite to the second groove surface 3022. The wall of the third via hole 330 protrudes from the first groove surface 3021 in the direction parallel to the base substrate 10. In this example, the first groove surface 3021, the second groove surface 3022 and the third groove surface 3023 of the first separation groove 302A are all formed by the third flexible layer 10E. In this example, the fourth via hole 340A and the first separation groove 302A are collectively referred to as a third opening.

Figure 7B:
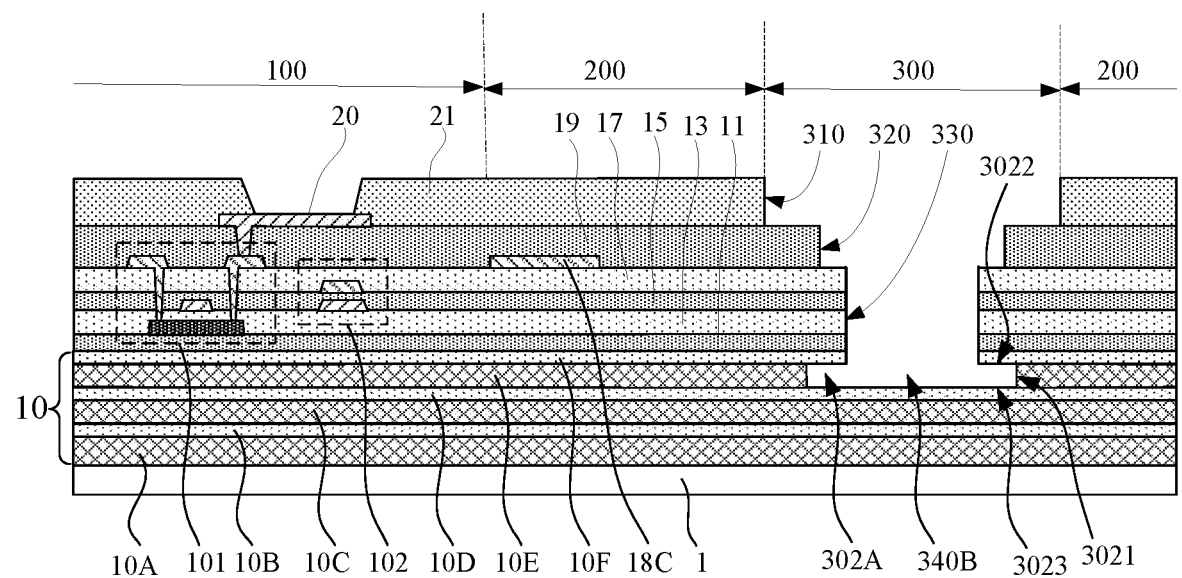
FIG. 7b is a schematic diagram of a structure after a fourth via hole and a first separation groove are formed on a third flexible layer of a base substrate of a hole area in some other exemplary embodiments.

In some exemplary embodiments, as shown in FIG. 7b, a fourth via hole 340B is formed on the third flexible layer 10E, the orthographic projection of the fourth via hole 340B on the flexible base substrate 10 includes the orthographic projection of the third via hole 330 on the flexible base substrate 10, and the third flexible layer 10E in the fourth via hole 340B is completely etched away. The wall of the third via hole 330 protrudes from the wall of the fourth via hole 340B in the direction parallel to the base substrate 10. In this example, the fourth via hole 340B is referred to as a third opening.

In this step, a material of the third flexible layer 10E is PI, and an etching method may be used for the process of forming the third opening on the third flexible layer 10E. Mixed gas of carbon tetrafluoride and oxygen (CF4/O2) may be used as etching gas. By adjusting a ratio of $CF_4/O_2$ in combination with a blocking effect of the second barrier layer 10D on the etching gas (the etching gas for etching the third flexible layer 10E has no effect on the second barrier layer 10D), transverse etching may be achieved to etch a structure of the third opening satisfying requirements, that is, the structures of the fourth via hole 340A and the first separation groove 302A or the structure of the fourth via hole 340B may be obtained by etching.

In some examples, the first, second and third openings described above may form the aperture 301, wherein the aperture 301 penetrates or does not penetrate through the base substrate 10. A single-layer flexible structure or a multi-layer flexible layer structure may be used for the base substrate 10.

Figure 8A:
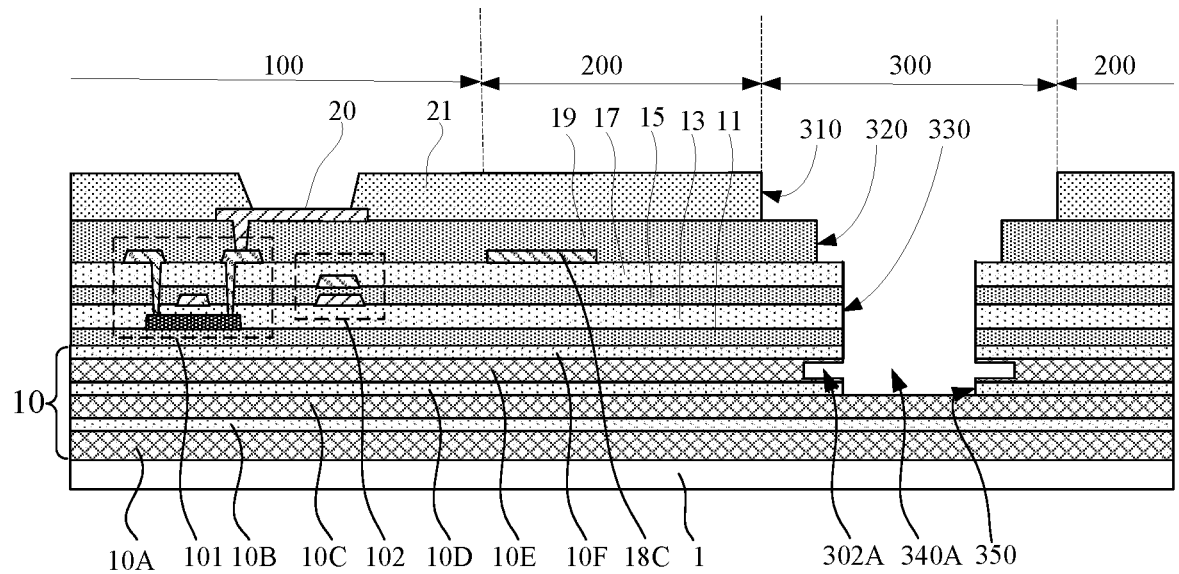
FIG. 8a is a schematic diagram of a structure after a fifth via hole is formed on a second barrier layer of a base substrate of a hole area in some exemplary embodiments.

(6) A fifth via hole 350 is formed on the second barrier layer 10D of the hole area 300, as shown in FIG. 8a. An orthographic projection of the fifth via hole 350 on the flexible base substrate 10 may overlap with the orthographic projection of the third via hole 330 on the flexible base substrate 10. The wall of the fifth via hole 350 and the wall of the third via hole 330 may be flush in the direction parallel to the base substrate 10. A first separation groove 302A is formed on the third flexible layer 10E.

Figure 8B:
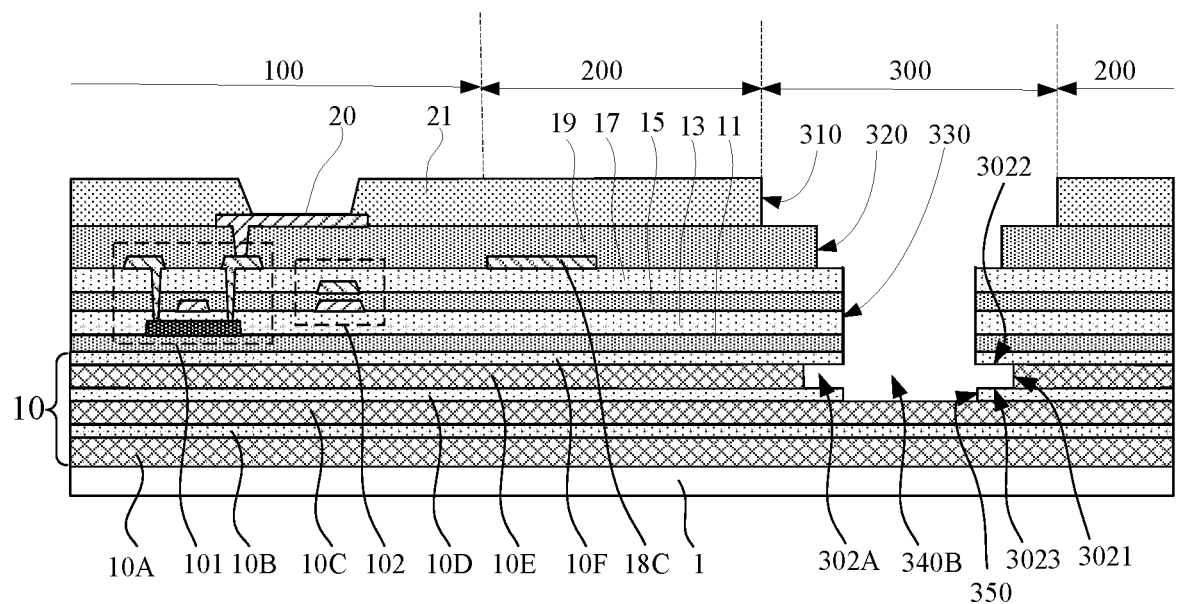
FIG. 8b is a schematic diagram of a structure after a fifth via hole is formed on a second barrier layer of a base substrate of a hole area in some other exemplary embodiments.

In some other examples, a fifth via hole 350 is formed on the second barrier layer 10D of the hole area 300, as shown in FIG. 8b. An orthographic projection of the fourth via hole 340B formed on the third flexible layer 10E on the flexible base substrate 10 includes an orthographic projection of the third via hole 330 and the fifth via hole 350 on the flexible base substrate 10. The wall of the fifth via hole 350 and the wall of the third via hole 330 are flush in the direction parallel to the base substrate 10 and both protrude from the wall of the fourth via hole 340B. A portion of the third barrier layer 10F protruding from the wall of the fourth via hole 340B is a first protrusion, and a portion of the second barrier layer 10D protruding from the wall of the fourth via hole 340B is a second protrusion. A surface of the first protrusion facing the base substrate 10, a surface of the second protrusion facing away from the base substrate 10, and the wall of the fourth via hole 340B form an inner surface of the first separation groove 302A. That is, in this example, the first groove surface 3021 of the first separation groove 302A is formed by the third flexible layer 10E, the second groove surface 3022 is formed by the surface of the first protrusion facing the base substrate 10, and the third groove surface 3023 is formed by the surface of the second protrusion facing away from the base substrate 10.

In other examples, the first groove surface 3021 of the first separation groove 302A is formed by the third flexible layer 10E, the second groove surface 3022 may be jointly formed by the third flexible layer 10E and the third barrier layer 10F, and the third groove surface 3023 may be jointly formed by the third flexible layer 10E and the second barrier layer 10D.

Figure 9:
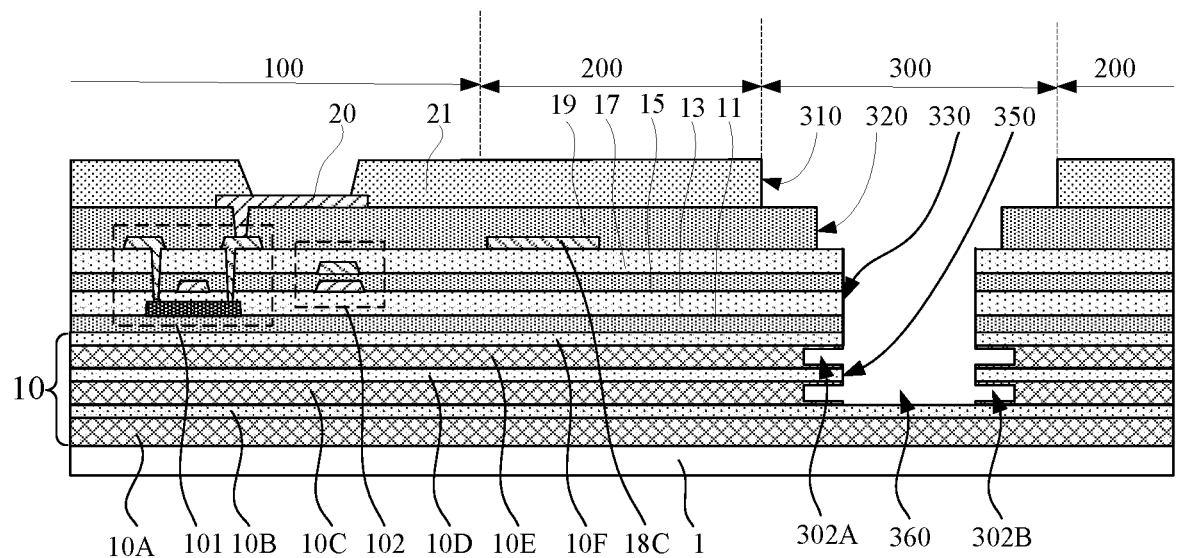
FIG. 9 is a schematic diagram of a structure after a sixth via hole and a second separation groove are formed on a second flexible layer of a base substrate of a hole area in some exemplary embodiments.

(7) A sixth via hole 360 and a second separation groove 302B are formed on the second flexible layer 10C. A method of forming the sixth via hole 360 and the second separation groove 302B in this step may be the same as the method of forming the fourth via hole 340A (or the fourth via hole 340B) and the first separation groove 302A on the third flexible layer 10E, and a structure of the second separation groove 302B may be the same as that of the first separation groove 302A, as shown in FIG. 9. FIG. 9 shows a structure in which the second separation groove 302B is formed on the second flexible layer 10C.

(8) A seventh via hole 370 is formed on the first barrier layer 10B. A method of forming the seventh via hole 370 on the first barrier layer 10B in this step may be the same as the method of forming the fifth via hole 350 on the second barrier layer 10D, and a structure of the seventh via hole 370 may be the same as that of the fifth via hole 350, as shown in FIG. 10a.

Figure 10A:
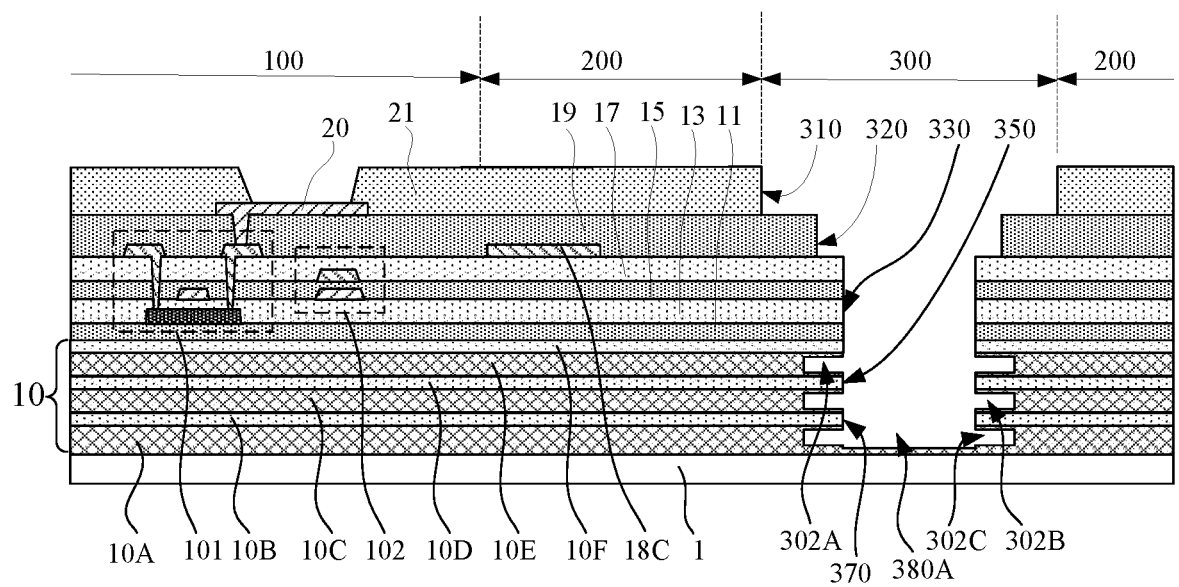
FIG. 10a is a schematic diagram of a structure after a seventh via hole is formed on a first barrier layer and a groove and a third separation groove are formed on a first flexible layer of a base substrate of a hole area in some exemplary embodiments.

(9) A groove 380A and a third separation groove 302C are formed on the first flexible layer 10A, as shown in FIG. 10a, wherein an orthographic projection of the groove 380A on the base substrate 10 includes, for example, an orthographic projection of the seventh via hole 370 on the base substrate 10. An orthographic projection of a notch of the groove 380A on the base substrate 10 may overlap with the orthographic projection of the seventh via hole 370 on the base substrate 10, or the orthographic projection of the notch of the groove 380A on the base substrate 10 may include the orthographic projection of the seventh via hole 370 on the base substrate 10.

In the direction parallel to the base substrate 10, the groove 380A forms a third separation groove 302C with respect to an enlarged portion of the wall of the seventh via hole 370. An inner surface of the third separation groove 302C may be formed by the first flexible layer 10A, or an inner surface of the third separation groove 302C may be jointly formed by portions of the first flexible layer 10A and the first barrier layer 10B facing the inside of the third separation groove 302C. In this example, since the groove 380A does not penetrate through the first flexible layer 10A, the aperture 301 finally formed in the hole area 300 does not penetrate through the base substrate 10.

Figure 10B:
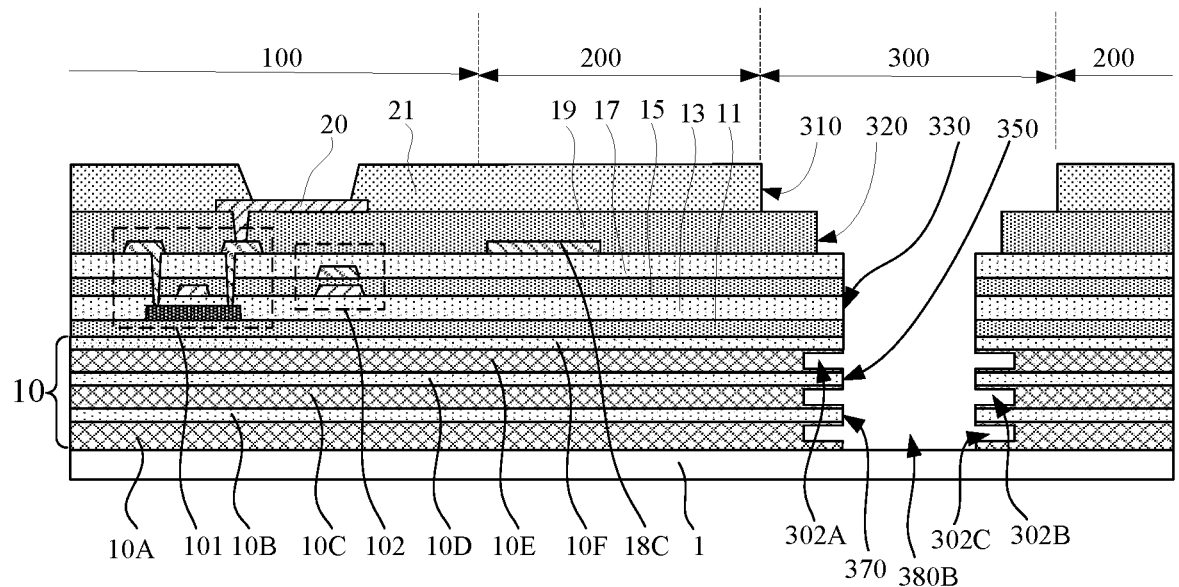
FIG. 10b is a schematic diagram of a structure after a seventh via hole is formed on a first barrier layer and an eighth via hole and a third separation groove are formed on a first flexible layer of a base substrate of a hole area in other some exemplary embodiments.

In some other examples, an eighth via hole 380B and a third separation groove 302C are formed on the first flexible layer 10A, as shown in FIG. 10b, wherein the eighth via hole 380B penetrates through the first flexible layer 10A. In this example, a method of forming the eighth via hole 380B and the third separation groove 302C may be the same as the method of forming the fourth via hole 340A (or the fourth via hole 340B) and the first separation groove 302A on the third flexible layer 10E, and a structure of the third separation groove 302C may be the same as that of the first separation groove 302A.

In some examples, at this point, an aperture 301 and a separation groove are formed in the hole area 300. The first via hole 310, the second via hole 320, the third via hole 330, the fourth via hole 340A (or the fourth via hole 340B), the fifth via hole 350, the sixth via hole 360, the seventh via hole 370 and the groove 380A (or the eighth via hole 380B) form the aperture 301, wherein the aperture 301 penetrates or does not penetrate through the base substrate 10. In the foregoing examples, three separation grooves, i.e., the first separation groove 302A, the second separation groove 302B, and the third separation groove 302C, are provided on the wall of the aperture 301 in a direction perpendicular to the base substrate 10, and the structures of the three separation grooves may be the same. The three separation grooves are respectively provided in the third flexible layer 10E, the second flexible layer 10C and the first flexible layer 10A of the flexible base substrate 10, and each of the flexible layers is provided with one of the separation grooves. The number of separation grooves provided on the wall of the aperture 301 may be equal to or less than the number of flexible layers of the flexible base substrate 10. In other examples, the number of flexible layers of the flexible base substrate 10 may be one, two or more than three. In the direction perpendicular to the base substrate 10, cross-sectional shapes of the first separation groove 302A, the second separation groove 302B, and the third separation groove 302C may be rectangular, trapezoidal, semi-elliptical, or irregular.

(10) An organic functional layer 22 and a cathode 23 are sequentially formed on the flexible base substrate 10 on which the aforementioned patterns are formed, as shown in FIG. 11a.

In some exemplary embodiments, both the organic functional layer 22 and the cathode 23 may be formed in the pixel island area 100, the connection bridge area 200 and the hole area 300 using an evaporation process. The organic functional layer 22 of the pixel island area 100 and the connection bridge area 200 covers the pixel definition layer 21, and the organic functional layer 22 of the pixel island area 100 is connected to the anode 20 exposed by a pixel opening of the pixel definition layer 21. The organic functional layer 22 of the hole area 300 covers the wall of the aperture 301 and the separation grooves (including, for example, the first separation groove 302A, the second separation groove 302B, and the third separation groove 302C). The cathode 23 is formed on the organic functional layer 22, and the anode 20, the organic functional layer 22 and the cathode 23 of the pixel island area 100 form a light emitting device. The cathode 23 may be made of any one or more of magnesium (Mg), silver (Ag), aluminum (Al), copper (Cu) and lithium (Li), or an alloy made of any one or more of the above metals.

Due to the presence of the separation groove, the organic functional layer 22 formed by evaporation is separated at the separation groove, and an inner surface of the separation groove includes a first groove surface 3021 facing the aperture 301, a second groove surface 3022 facing a back side of the base substrate 10, and a third groove surface 3023 opposite to the second groove surface 3022. Generally, the organic functional layer 22 is disconnected at an intersection of the first groove surface 3021 and the second groove surface 3022, and a thickness of the organic functional layer 22 becomes thinner in the vicinity of the intersection of the first groove surface 3021 and the second groove surface 3022, as shown in FIG. 11b. FIG. 11b is a partially enlarged view at position A in FIG. 11a. Taking the first separation groove 302A as an example, the organic functional layer 22 is disconnected at positions P1 and P2 in the sectional view. The organic functional layer 22 is also disconnected at respective positions in the second separation groove 302B and the third separation groove 302C. A depth of the separation groove in the direction parallel to the base substrate 10 and its width in the direction perpendicular to the base substrate 10 may be designed as required, as long as the organic functional layer 22 can be ensured to be disconnected at the separation groove. Similarly, the cathode 23 is formed on the organic functional layer 22, and a position where the cathode 23 is disconnected at the separation groove corresponds to the position where the organic functional layer 22 is disconnected at the separation groove. Since both the organic functional layer 22 and the cathode 23 are disconnected at the separation groove, an intrusion path of water and oxygen is blocked, that is, the water and oxygen do not intrude into the organic functional layer 22 and the cathode 23 of the pixel island area 100, thereby ensuring the packaging effect. The organic functional layer 22 and the cathode 23 may be separated at multiple separation grooves, that is, the organic functional layer 22 and the cathode 23 may be separated at of the multiple positions, thereby adding the multiple guarantee fir separation. In addition, since each separation groove is provided on the wall of the aperture 301, the separation groove does not occupy extra space outside the aperture 301, does not reduce the pixel density, and does not need a mask plate during the formation of the separation groove, thus saving costs.

(11) An encapsulation structure layer 7 is formed on the flexible base substrate 10 on which the aforementioned patterns are formed. The encapsulation structure layer may include a first inorganic layer 24, an organic encapsulation layer 25, and a second inorganic layer 26 which are stacked. The first inorganic encapsulation layer 24 covers the cathode 23, the organic encapsulation layer 25 is provided in the pixel island area 100, and the second inorganic encapsulation layer 26 covers the first inorganic encapsulation layer 24 and the organic encapsulation layer 25. The hole area 300 includes the first inorganic encapsulation layer 24 and the second inorganic encapsulation layer 26 that are stacked, wherein the first inorganic encapsulation layer 24 and the second inorganic encapsulation layer 26 cover the cathode 23 of the hole area 300 and encapsulate the organic functional layer 22 and the cathode 23, as shown in FIG. 2c. The first inorganic encapsulation layer 24, the organic encapsulation layer 25 and the second inorganic encapsulation layer 26 may be made by Chemical Vapor Deposition (CVD), sputtering, or other coating manners. The encapsulation structure layer serves to isolate water and oxygen, and can effectively prevent the contact between air and the organic functional layer 22 and the cathode 23. Finally, the flexible base substrate 10 on which all the film layers have been manufactured is peeled off from the carrier plate 1 to obtain a display substrate.

Based on the aforementioned contents, an embodiment of the present disclosure further provides a method for manufacturing a display substrate; the display substrate includes a stretchable area; the stretchable area includes multiple pixel island areas spaced apart from each other, multiple hole areas, and connection bridge areas located between the pixel island areas and the hole areas; each of the hole areas is provided with one or more apertures which penetrate through or do not penetrate through a base substrate; the manufacturing method includes:

forming a composite structural layer on the base substrate of the hole areas, wherein the base substrate includes a flexible layer and a barrier layer that are stacked, the composite structural layer includes an inorganic composite insulating layer provided on the barrier layer and an organic composite layer provided on the inorganic composite insulating layer;

forming a first opening on the organic composite layer, wherein the first opening exposes a surface of the inorganic composite insulating layer;

forming a second opening on a portion of the inorganic composite insulating layer exposed by the first opening, wherein the second opening penetrates through the barrier layer and exposes a surface of the flexible layer;

forming a third opening on the flexible layer, wherein the third opening penetrates through or does not penetrate through the flexible layer, an orthographic projection of the third opening on the base substrate includes an orthographic projection of the second opening on the base substrate, the first opening, the second opening, and the third opening form the aperture, the third opening forms a separation groove with respect to an enlarged portion of the second opening in a direction parallel to the base substrate, and the separation groove is provided on a wall of the aperture; and forming a functional film layer on the composite structural layer, wherein the functional film layer is provided on the wall of the aperture and is separated at the separation groove.

An embodiment of the present disclosure further provides a display device, including the display substrate described in any one of the aforementioned embodiments. The display device may be any product or component with a display function, such as a mobile phone, a tablet computer, a television, a display, a laptop computer, a digital photo frame, or a navigator.

In the description herein, orientation or positional relations indicated by terms "up", "down", "left", "right", "top", "inside", "outside", "axial direction", "four corners" and the like are based on the orientation or positional relations shown in the drawings, and are for ease and brief description of the present disclosure and are not intended to indicate or imply that the structures referred to must have a specific orientation, or be constructed and operated in a particular orientation, and therefore these terms should not be construed as limitations on the present disclosure.

In the description herein, the terms "connection", "fixed connection", "installation" and "assembly" are to be understood in a broad sense, for example, a connection may be a fixed connection, or a detachable connection, or may be an integral connection, unless explicitly specified and defined otherwise. The terms "installation", "connection" and "fixed connection" may refer to a direct connection, or may an indirect connection through an intermediate medium, or may be an internal connection between two elements. Those of ordinary skills in the art may understand the meanings of the above terms in the present disclosure.

The invention claimed is:

1. A display substrate, comprising a stretchable area, wherein the stretchable area comprises a plurality of pixel island areas spaced apart from each other, a plurality of hole areas, and connection bridge areas located between the pixel island areas and the hole areas; each of the hole areas is provided with one or more apertures and comprises a composite structural layer stacked on a base substrate, the one or more apertures penetrate through the composite structural layer and a portion of an aperture is provided in the base substrate, the aperture penetrates through or does not penetrate through the base substrate, a wall of the aperture is provided with at least one separation groove, and an inner surface of the separation groove comprises a first groove surface facing the aperture, a second groove surface facing a back side of the base substrate, and a third groove surface opposite to the second groove surface; and each of the hole areas further comprises a functional film layer provided on the composite structural layer and on the first groove surface, the second groove surface and the third groove surface of the separation groove, the functional film layer becomes thinner in a vicinity of an intersection of the first groove surface and the second groove surface, and the functional film layer is disconnected at an intersection of the first groove surface and the second groove surface.

2. The display substrate according to claim 1, wherein the base substrate comprises a flexible layer and a barrier layer that are stacked, and the separation groove is provided on the flexible layer.

3. The display substrate according to claim 2, wherein the base substrate comprises a plurality of flexible layers and a plurality of barrier layers, the flexible layers and the barrier layers are alternately provided, and at least one of the flexible layers is provided with the separation groove.

4. The display substrate according to claim 3, wherein the base substrate comprises a first flexible layer, a first barrier layer, a second flexible layer, a second barrier layer, a third flexible layer and a third barrier layer that are stacked, the composite structural layer is provided on the third barrier layer, the third flexible layer is provided with a first separation groove, the second flexible layer is provided with a second separation groove, and the first flexible layer is provided with a third separation groove.

5. The display substrate according to claim 2, wherein the first groove surface, the second groove surface and the third groove surface are all formed by the flexible layer where the separation groove is located.

6. The display substrate according to claim 2, wherein the first groove surface is formed by the flexible layer where the separation groove is located;

the second groove surface is jointly formed by the flexible layer where the separation groove is located and a film layer provided on a side surface of the flexible layer away from the back side of the base substrate, or the second groove surface is formed by a film layer provided on a side surface of the flexible layer where the separation groove is located away from the back side of the base substrate; and the third groove surface is jointly formed by the flexible layer where the separation groove is located and a film layer provided on a side surface of the flexible layer facing the back side of the base substrate, or the third groove surface is formed by a film layer provided on a side surface of the flexible layer where the separation groove is located facing the back side of the base substrate.

7. The display substrate according to claim 1, wherein the separation groove is provided in a circumferential direction of the aperture, and has a closed annular structure.

8. The display substrate according to claim 1, wherein a pixel island area comprises a drive structure layer provided on the base substrate and a plurality of light emitting devices provided on the drive structure layer, the drive structure layer comprises a pixel driving circuit, each of the plurality of light emitting devices comprises an anode, an organic functional layer, and a cathode that are stacked, the organic functional layer comprises an organic light emitting layer, the functional film layer comprises a first functional film layer and a second functional film layer that are stacked, the first functional film layer has a same material as one film layer in the organic functional layer of any one of the light emitting devices, and the second functional film layer has a same material as the cathode.

9. The display substrate according to claim 1, wherein the composite structural layer comprises an inorganic composite insulating layer provided on the base substrate and an organic composite layer provided on the inorganic composite insulating layer, a side surface of the inorganic composite insulating layer facing the aperture protrudes from a side surface of the organic composite layer facing the aperture in a direction parallel to the base substrate.

10. The display substrate according to claim 9, wherein the organic composite layer comprises a first organic layer provided on the inorganic composite insulating layer, and a second organic layer provided on the first organic layer, a plurality of layers that constitute the inorganic composite insulating layer comprise side surfaces facing the aperture, with the side surfaces facing the aperture being flush provided, and in the direction parallel to the base substrate, a side surface of the first organic layer facing the aperture protrudes from a side surface of the second organic layer facing the aperture, and the side surfaces of the plurality of layers facing the aperture protrude from the side surface of the first organic layer facing the aperture.

11. The display substrate according to claim 1, wherein the aperture has a rectangular shape, and has a width of 5 microns to 20 microns and a length of 50 microns to 800 microns; or the aperture has an arc shape, and has a diameter of 50 microns to 500 microns.

12. The display substrate according to claim 1, wherein a depth of the separation groove in a direction parallel to the base substrate is greater than or equal to 0.5 microns.

13. The display substrate according to claim 2, wherein the flexible layer has a thickness of 5 microns to 12 microns.

14. A display device, comprising the display substrate according to claim 1.

15. A method for manufacturing a display substrate, the display substrate comprising a stretchable area, the stretchable area comprising a plurality of pixel island areas spaced apart from each other, a plurality of hole areas, and connection bridge areas located between the pixel island areas and the hole areas, each of the hole area being provided with one or more apertures which penetrate through or do not penetrate through a base substrate, wherein the method comprises:

forming a composite structural layer on the base substrate of the hole areas, wherein the base substrate comprises a flexible layer and a barrier layer that are stacked, the composite structural layer comprises an inorganic composite insulating layer provided on the barrier layer and an organic composite layer provided on the inorganic composite insulating layer;

forming a first opening in the organic composite layer, wherein the first opening exposes a surface of the inorganic composite insulating layer;

forming a second opening in a portion of the inorganic composite insulating layer exposed by the first opening, wherein the second opening penetrates through the barrier layer and exposes a surface of the flexible layer;

forming a third opening in the flexible layer, wherein the third opening penetrates through or does not penetrate through the flexible layer, an orthographic projection of the third opening on the base substrate comprises an orthographic projection of the second opening on the base substrate, the first opening, the second opening, and the third opening form an aperture, the third opening forms a separation groove with respect to an enlarged portion of the second opening in a direction parallel to the base substrate, and the separation groove is provided on a wall of the aperture, and an inner surface of the separation groove comprises a first groove surface facing the aperture, a second groove surface facing a back side of the base substrate, and a third groove surface opposite to the second groove surface; and forming a functional film layer on the composite structural layer, wherein the functional film layer is provided on the first groove surface, the second groove surface and the third groove surface of the separation groove, the functional film layer becomes thinner in a vicinity of an intersection of the first groove surface and the second groove surface, and the functional film layer is disconnected at an intersection of the first groove surface and the second groove surface.

16. The method for manufacturing the display substrate according to claim 15, wherein the base substrate comprises a plurality of flexible layers and a plurality of barrier layers, the flexible layers and the barrier layers are alternately provided, and at least one of the flexible layers is provided with the separation groove.

* * * * *